(12) United States Patent
Kimura (10) Patent No.: US 6,781,567 B2
(45) Date of Patent: Aug. 24, 2004

(54) DRIVING METHOD FOR ELECTRO-OPTICAL DEVICE, ELECTRO-OPTICAL DEVICE, AND ELECTRONIC APPARATUS

(75) Inventor: Mutsumi Kimura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 77 days.

(21) Appl. No.: 09/956,995

(22) Filed: Sep. 21, 2001

(65) Prior Publication Data

US 2002/0041276 A1 Apr. 11, 2002

(30) Foreign Application Priority Data

Sep. 29, 2000 (JP) ........................................ 2000-300859

(51) Int. Cl.$^7$ ................................................ G09G 3/36
(52) U.S. Cl. ............................ 345/92; 345/90; 345/98
(58) Field of Search ............................ 345/76, 87–100, 345/204, 211, 214; 315/169.1, 169.2, 169.3

(56) References Cited

U.S. PATENT DOCUMENTS

| 5,903,248 A | * | 5/1999 | Irwin | 345/98 |
| 6,528,950 B2 | * | 3/2003 | Kimura | 345/92 |
| 2001/0026257 A1 | * | 10/2001 | Kimura | 345/87 |
| 2001/0052941 A1 | * | 12/2001 | Matsunaga et al. | 348/308 |
| 2003/0090481 A1 | * | 5/2003 | Kimura | 345/211 |

FOREIGN PATENT DOCUMENTS

| CN | 311213 | 7/1997 |
| EP | 1 003 151 A2 | 5/2000 |
| EP | 1 037 192 A2 | 9/2000 |
| EP | 1 193 677 A2 | 4/2002 |
| JP | 9-233107 | 9/1997 |

OTHER PUBLICATIONS

Kimura et al, "Low–Temperature Polysilicon Thin–Film Transistor Driving with Integrated Driver for High–Resolution Light Emitting Polymer Display," IEEE Transactions On Electron Devices, vol. 46, No. 12, Dec. 1999.

Inukai et al., "36.4L: Late News Paper: 4.0–in. TFT–OLED Displays and a Novel Digital Driving Method," SID 00 Digest.

Shimoda et al., "High Resolution Light Emitting Polymer Display Driven by Low Temperature Polysilicon Thin Film Transistor with Integrated Driver," Asia Display 98, pp. 217–220.

(List continued on next page.)

Primary Examiner—Bipin Shalwala
Assistant Examiner—David L. Lewis
(74) Attorney, Agent, or Firm—Oliff & Berridge, PLC (57) ABSTRACT

To provide a method for implementing a gray-scale display of an electro-optical device according to a time ratio gray-scale method without providing reset lines.

In an electro-optical device comprising, at an intersection of a scanning line and a data line, an electro-optical element, a driving transistor for driving the electro-optical element, a switching transistor for controlling the driving transistor, and a reset transistor having the function of resetting the driving transistor to a non-conducting state, a gray-scale is obtained by performing a plurality of set-reset operations, each set-reset operation comprising: a setting step of supplying an on-signal to the switching transistor via the scanning line, and of supplying a set signal for selecting a conducting state or a non-conducting state of the driving transistor to the driving transistor via the data line and the switching transistor in accordance with the on-signal; and a resetting stop of supplying an on-signal for the reset transistor via the scanning line so as to reset the driving transistor to the non-conducting state.

20 Claims, 9 Drawing Sheets

OTHER PUBLICATIONS

Mizukami et al., "36.1: 6–Bit Digital VGA OLED," SID 00 Digest.

Kimura et al., "An area–ratio gray–scale method to achieve image uniformity in TFT–LEPDs," Journal of the SID 8/2, pp. 93–97.

Kimura et al., "Low–Temperature Poly–Si TFT Driven Light–Emitting–Polymer Displays and Digital Gray Scale for Uniformity," IDW 1999, pp. 171–174.

Kimura et al., "Low–Temperature Poly–Si TFT Display using Light–Emitting–Polymer," Am–LCD 2000, pp. 245–248.

Kimura et al., "TFT–LEPD with Image Uniformity by Area Ratio Gray Scale," pp. 71–74.

* cited by examiner

DRIVING METHOD FOR ELECTRO-OPTICAL DEVICE, ELECTRO-OPTICAL DEVICE, AND ELECTRONIC APPARATUS

BACKGROUND OF THE INVENTION

1. Field of Invention

The present invention relates to a driving method for an organic electro-luminescence display device, a driving method for an electro-optical device suitable for use with a display device, such as an organic electro-luminescence display device, an electro-optical device, and an electronic apparatus provided with such an electro-optical device.

2. Description of Related Art

Attention is being given to organic electro-luminescence display devices using organic materials as luminescent materials of luminescent elements since they have a wide viewing angle, and will potentially meet market demands, i.e., demands for thinner, lighter, smaller, and lower power-consuming display devices.

Unlike conventional liquid crystal display devices, in organic electro-luminescence display devices, a luminescence state of the luminescent element must be controlled by a current. One such control method is the conductance control method (T. Shimoda, M. Kimura, et al., Proc. Asia Display 98, 217; M. Kimura, et al., IEEE Trans. Ele. Dev. 46, 2282 (1999); M. Kimura, et al., Proc. IDW 99, 171; and M. Kimura et al., Dig. AM-LCD 2000, to be published). In this method, the luminescence state of the luminescent element is controlled by a current value, which is an analog value, and more specifically, it is controlled by changing the potential applied to a gate electrode of a driving transistor that drives the luminescent element. When thin-film transistors having different current characteristics are used, however, the difference in the current characteristics of the individual transistors may sometimes directly result in non-uniformity in the luminescence state of the luminescent elements.

Accordingly, the area ratio gray-scale method (M. Kimura, et al., Proc. Euro Display '99 Late-News Papers, 71, Japanese Unexamined Patent Application Publication No. 9-233107, M. Kimura, et al., Proc. IDW 99,171, M. Kimura, et al, J. SID, to be published; and M. Kimura, et al., Dig. AM-LCD 2000 to be published) has been proposed. In the area ratio gray-scale method, unlike the above-mentioned conductance control method, the luminescence state of the luminescent elements is controlled without using a luminescence state at an intermediate luminance. More specifically, in this method, the gray-scale is displayed as follows. Pixels disposed in a matrix are divided into a plurality of sub-pixels, and it is determined whether the luminescent elements contained in the sub-pixels are either in a complete luminescence state or a complete non-luminescence state. Then, among the plurality of sub-pixels, the total area of the sub-pixels in the complete luminescence state is changed. In the area ratio gray-scale method, it is not necessary to set an intermediate current value corresponding to the luminescence state of the intermediate luminance. Accordingly, the influence of the current characteristics of the transistors that drives the luminescent elements can be reduced, thereby achieving a uniform image quality. In this method, however, the number of gray-scale levels is restricted by the number of sub-pixels. For a greater number of gray-scale levels, pixels must be divided into a greater number of sub-pixels, which makes the pixel structure complicated.

Accordingly, the time ratio gray-scale method (M. Kimura, et al., Proc. IDW 99, 171; M. Kimura, et al., Dig. AM-LCD 2000, to be published; M. Mizukami, et al., Dig. SID 2000, 912; and K. Inukai, et al., Dig. SID 2000,924) has been proposed. In the time ratio gray-scale method, the representation of the gray-scale is implemented by changing the period for which the luminescent elements in one frame are in the complete luminescence state. Accordingly, unlike the area ratio gray-scale method, it is not necessary to provide many sub-pixels for obtaining a greater number of gray-scale levels, and also, the time ratio gray-scale method can be used together with the area ratio gray-scale method. Thus, it is expected that the time ratio gray-scale method will be a promising method for digitally displaying a gray-scale.

SUMMARY OF THE INVENTION

However, in the SES (Simultaneous-Erasing-Scan) time ratio gray-scale method, which is reported in "K. Inukai, et al., Dig. SID 2000,924", in addition to the scanning lines, reset lines are required, and thus, the luminescence area is disadvantageously reduced.

Accordingly, a first object of the present invention is to provide a method for implementing the representation of a gray-scale of an electro-optical device without reset lines, and in particular, to provide a method for implementing the representation of the gray-scale of an electro-optical device, such as an organic electro-luminescence display device, according to the time ratio gray-scale method. A second object of the present invention is to provide an electro-optical device that is driven by the above-described driving method.

In order to achieve the first object, a first driving method for an electro-optical device according to the present invention is a driving method for an electro-optical device which includes, at an intersection of a scanning line and a data line, an electro-optical element, a driving transistor that drives the electro-optical element, a switching transistor that controls the driving transistor, and a reset transistor that resets the driving transistor to a non-conducting state. The driving method includes: a setting step of supplying an on-signal to cause the switching transistor to be in an on-state to the switching transistor via the scanning line, and of supplying a set signal to select a conducting state or a non-conducting state of the driving transistor to the driving transistor via the data line and the switching transistor in accordance with a period for which the on-signal is supplied; and a resetting step of supplying an on-signal to cause the reset transistor to be in an on-state to the reset transistor via the scanning line so as to reset the driving transistor to the non-conducting state. Accordingly, by supplying the on-signal for the switching transistor and the on-signal for the reset transistor via the same scanning line, the luminescence period can suitably be set without a reset line. In this specification, the electro-optical element and the electro-optical device respectively indicate an element and a device in which the luminescence state or the optical characteristic is electrically controlled. Specific examples of the electro-optical device include display devices, such as luminescence display devices, liquid crystal display devices, and electrophoretic display devices.

Throughout the specification, the "step of supplying an on-signal to the switching transistor via the scanning line, and of supplying a set signal to select a conducting state or a non-conducting state of the driving transistor to the driving transistor via the data line and the switching transistor in accordance with the on-signal" is defined as the "setting step". The "step of resetting the driving transistor to the non-conducting state by supplying an on-signal to cause the reset transistor to be in the on-state to the reset transistor via the scanning line" is defined as the "resetting step".

According to a second driving method for an electro-optical device of the present invention, in the above-described driving method for an electro-optical device, the electro-optical device may further include a power line that supplies a current to the electro-optical element via the driving transistor, and one end of the reset transistor may be connected to the power line.

According to a third driving method for an electro-optical device of the present invention, the conductivity type of the switching transistor and the conductivity type of the reset transistor may be different from each other. More specifically, for example, if the switching transistor is n-type, the reset transistor is p-type. If the switching transistor is p-type, the reset transistor is n-type. Accordingly, by suitably selecting a high-potential signal or a low-potential signal, the switching transistor and the reset transistor can be complementarily operated.

According to a fourth driving method for an electro-optical device of the present invention, in the above-described driving method for an electro-optical device, the conductivity types of the switching transistor, the driving transistor, and the reset transistor may be respectively n-type, p-type, and p-type. That is, when a high-potential scanning signal is supplied, the switching transistor enters the on-state. When a low-potential scanning signal is supplied, the reset transistor enters the on-state. Thus, the switching transistor and the reset transistor can be complementarily operated.

According to a fifth driving method for an electro-optical device of the present invention, in the above-described driving method for an electro-optical device, a voltage VS corresponding to the on-signal to cause the switching transistor to be in the on-state, a voltage VR corresponding to the on-signal to cause the reset transistor to be in the on-state, and a voltage V0 V0 corresponding to an off-signal to cause both the switching transistor and the reset transistor to be in an off-state may satisfy a relational expression: VS>V0>VR.

According to a sixth driving method for an electro-optical device of the present invention, in the above-described driving method for an electro-optical device, the voltage VS, the voltage VR, and the voltage V0 may satisfy relational expressions: $-VS \approx VR$, and V0=0V (voltages). According to the driving methods for electro-optical devices set forth above, only by setting three voltage values, such as VS, V0, and VR, the on-off operation of the switching transistor and the on-off operation of the reset transistor can be performed.

According to a seventh driving method for an electro-optical device of the present invention, in the above-described driving method for an electro-optical device, while the switching transistor is in the on-state, the reset transistor is in the off-state, and, while the reset transistor is in the on-state, the switching transistor is in the off-state. With this arrangement, the state of the electro-optical element and the period for which the selected state is retained can precisely be set.

According to an eighth driving method for an electro-optical device of the present invention, in the above-described driving method for an electro-optical device, a gray-scale may be obtained by setting a time interval between the setting step and the resetting step. That is, the time interval between the setting step and the resetting step corresponds to the period for which the selected state of the electro-optical element is retained. Thus, by suitably setting this time interval, a gray-scale can be obtained.

According to a ninth driving method for an electro-optical device of the present invention, in the above-described driving method for an electro-optical device, a gray-scale may be obtained by performing a plurality of set-reset operations, each set-reset operation including the setting step and the resetting step. In the setting step, the state of the electro-optical element is selected, and in the resetting step, the period for which the selected state is retained is determined. Thus, by repeating a plurality of above-described set-reset operations, a multi-level gray-scale can be obtained. Throughout this specification, the set-reset operation is defined as the operation including the setting step and the resetting step.

According to a tenth driving method for an electro-optical device of the present invention, in the above-described driving method for an electro-optical device, the time interval between the setting step and the resetting step may be different for each of the plurality of set-reset operations.

According to an eleventh driving method for an electro-optical device of the present invention, in the above-described driving method for an electro-optical device, the time interval between the setting step and the resetting step for each of the plurality of set-reset operations may be completely different from the others, and the ratio of time intervals for the plurality of set-reset operations may be about $1:2: \ldots :2^n$ (n being an integer of one or more) based on the minimum time interval. For example, if two set-reset operations with a time interval ratio of 1:2 are performed, four gray-scale levels, i.e., 0, 1, 2, 3, can be displayed. If two set-reset operations with a time interval ratio of 1:1 are performed, three gray-scale levels, i.e., 0, 1, and 2 can be displayed. That is, in this driving method for an electro-optical device, a maximum number of gray-scale levels can be obtained by a minimum number of set-reset operations. The time interval ratio does not have to precisely be $1:2: \ldots :2^n$ (n being an integer of one or more), and may be sufficient to such a degree to satisfy a required gray-scale precision.

According to a twelfth driving method for an electro-optical device of the present invention, in the above-described driving method for an electro-optical device, the set signal may be a signal to set the driving transistor to be in the conducting state rather than the signal to select the conducting state or the non-conducting state of the driving transistor. This means that an intermediate conducting state other than the two states, i.e., the conducting state and the non-conducting state, of the driving transistor is selectable. This can be implemented by supplying the set signal as a signal having three or more consecutive or discrete values. This driving method is effective to implement many gray-scale levels.

According to a thirteenth driving method for an electro-optical device of the present invention, in the above-described driving method for an electro-optical device, the electro-optical element may be an organic electro-luminescence element. The organic electro-luminescence element is a luminescent element using an organic material as an electric-field luminescent material.

A first electro-optical device of the present invention is driven by the above-described driving method for an electro-optical device. That is, in this electro-optical device, by supplying the on-signal for the switching transistor and the on-signal for the reset transistor via the same scanning line, the period for which the state of the electro-optical element selected in the setting step can suitably be set without a reset line.

A second electro-optical device of the present invention is an electro-optical device including, at an intersection of a scanning line and a data line, an electro-optical element, a driving transistor that drives the electro-optical element, a switching transistor that controls the driving transistor, and a reset transistor that resets the driving transistor to a non-conducting state. The electro-optical device includes at least one drive circuit that generates a signal to set the switching transistor and the reset transistor to be in an on-state or an off-state, and that generates a signal to set the driving transistor in accordance with the signal to set the switching transistor to be in the on-state. It is not essential that only the single drive circuit is used that "generates a signal to set the switching transistor and the reset transistor to be in an on-state or an off-state, and that generates a signal to set the driving transistor in accordance with the signal for setting the switching transistor to be in the on-state". A plurality of drive circuits may be used.

A third electro-optical device of the present invention is an electro-optical device including, at an intersection of a scanning line and a data line, an electro-optical element, a driving transistor that drives the electro-optical element, a switching transistor that controls the driving transistor, and a reset transistor that resets the driving transistor to a non-conducting state. The electro-optical device includes: a scanning line driver that supplies a signal to set the switching transistor and the reset transistor to be in an on-state or an off-state to the scanning line; and a data line driver that supplies a signal to set the driving transistor to the data line in accordance with an operation of the scanning line driver.

A fourth electro-optical device of the present invention is an electro-optical device including, at an intersection of a scanning line and a data line, an electro-optical element, a driving transistor that drives the electro-optical element, a switching transistor that controls the driving transistor, and a reset transistor that resets the driving transistor to a non-conducting state. An on-signal that performs a setting step of setting a display condition of the electro-optical element is supplied to the switching transistor via the scanning line, and an on-signal that performs a resetting step of resetting a display condition of the electro-optical element is supplied to the reset transistor via the scanning line. In the above description, the definitions of the "setting step" and the "resetting step" are substantially similar to those of the setting step and the resetting step set forth previously above.

In the above-described electro-optical device, a fifth electro-optical device of the present invention may further include a power line that supplies a current to the electro-optical element via the driving transistor, and one end of the reset transistor may be connected to the power line. Accordingly, the first through fifth electro-optical devices of the present invention do not require a reset line that performs the time ratio gray-scale method. Advantageously, therefore, it is possible to ensure a sufficient display area. If more gray-scale levels are required, the time ratio gray-scale method can be employed with the area ratio gray-scale method by providing sub pixels in the pixels of the electro-optical device.

According to a sixth electro-optical device of the present invention, in the above-described electro-optical device, the electro-optical element may be an organic electro-luminescence element.

A first electronic apparatus of the present invention is an electronic apparatus in which the above-described electro-optical device is installed.

DETAILED DESCRIPTION OF PREFERRED EMBODIMENTS

Preferable embodiments of the present invention are described below.

A basic circuit used in an embodiment of the present invention includes a poly-crystal silicon thin-film transistor formed by a low-temperature process at 600° C. or lower (low-temperature poly-Si TFT). The low-temperature poly-Si TFT can be formed on a large, inexpensive glass substrate, and can integrate a driving circuit on a panel. Accordingly, it is suitable for manufacturing an electro-optical device, such as a luminescence display device. Additionally, the low-temperature poly-Si TFT is small, but has a high current supplying power. Accordingly, it is suitable for use in a high-precision current luminescence display device. The present invention is also applicable to an electro-optical device driven by other types of transistors, such as an amorphous silicon thin-film transistor (a-Si TFT), a silicon-based transistor, and an organic thin-film transistor using an organic semiconductor.

Figure 1:
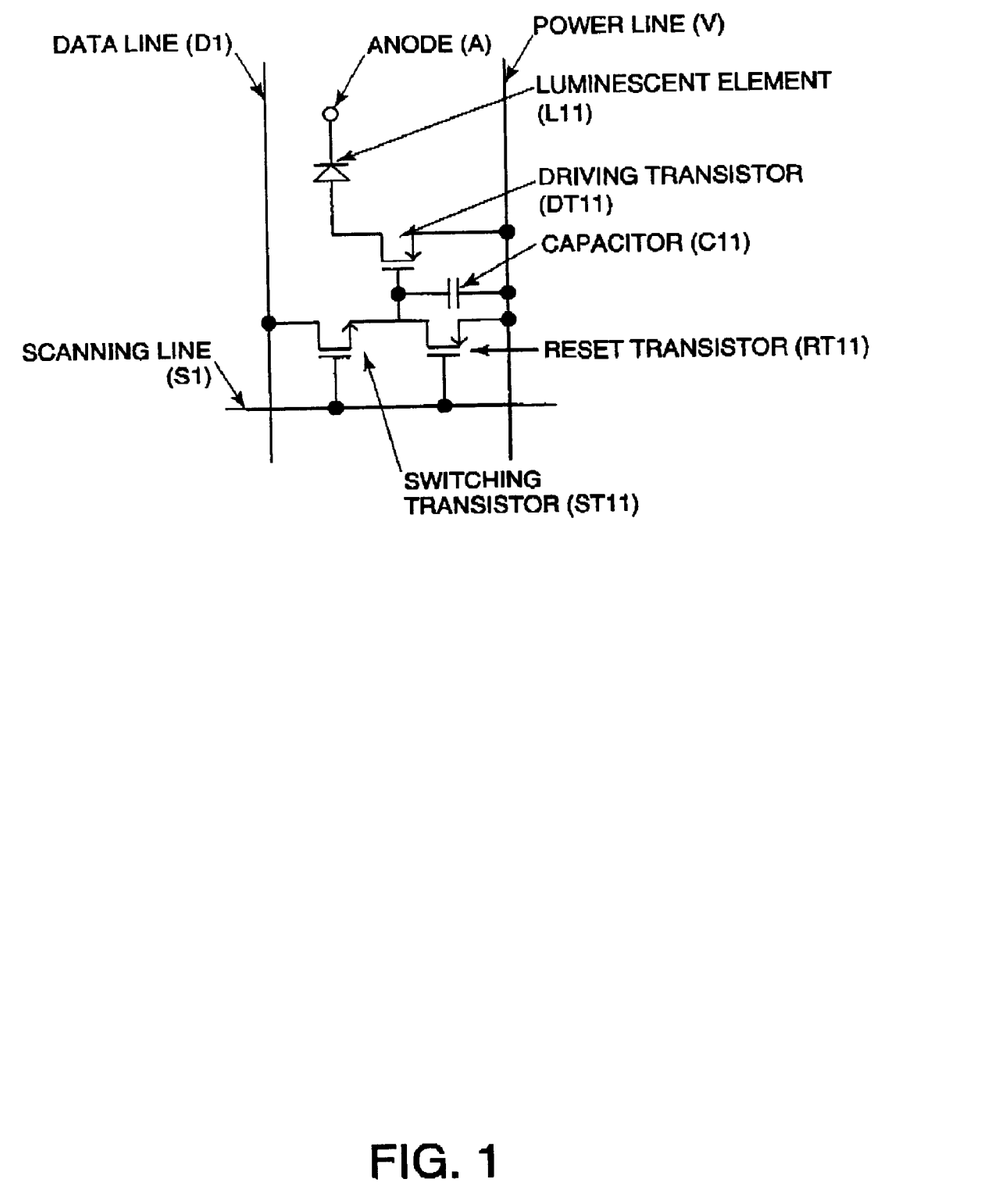
FIG. 1 is a schematic of a pixel equivalent circuit of an electro-optical device according to an embodiment of the present invention.

The equivalent circuit of one pixel of an electro-optical device according to an embodiment of the present invention is shown in FIG. 1. In this electro-optical device, a scanning line (S1), a data line (D1), and a power line (V) are formed, and a luminescent element (L11), a driving transistor (DT11) that drives the luminescent element (L11), a switching transistor (ST11) that controls the driving transistor (DT11), a reset transistor (RT11) that resets the driving transistor (DT11), and a capacitor (C11) are provided at the intersection of the scanning line (S1) and the data line (D1). One end of the luminescent element (L11) is connected to an anode (A). The driving transistor (DT11) is p-type. Accordingly, the driving transistor (DT11) enters a conducting state selected by a low-potential data signal to cause the luminescent element (L11) to be in the luminescence state. In contrast, the driving transistor (DT11) enters a non-conducting state by a selected high-potential data signal to cause the luminescent element (L11) to be in the non-luminescence state. In the pixel equivalent circuit shown in FIG. 1, the switching transistor (ST11), the driving transistor (DT11), and the reset transistor (RT11) are n-type, p-type, and p-type, respectively. However, the present invention is not limited to this structure or its function.

Figure 2:
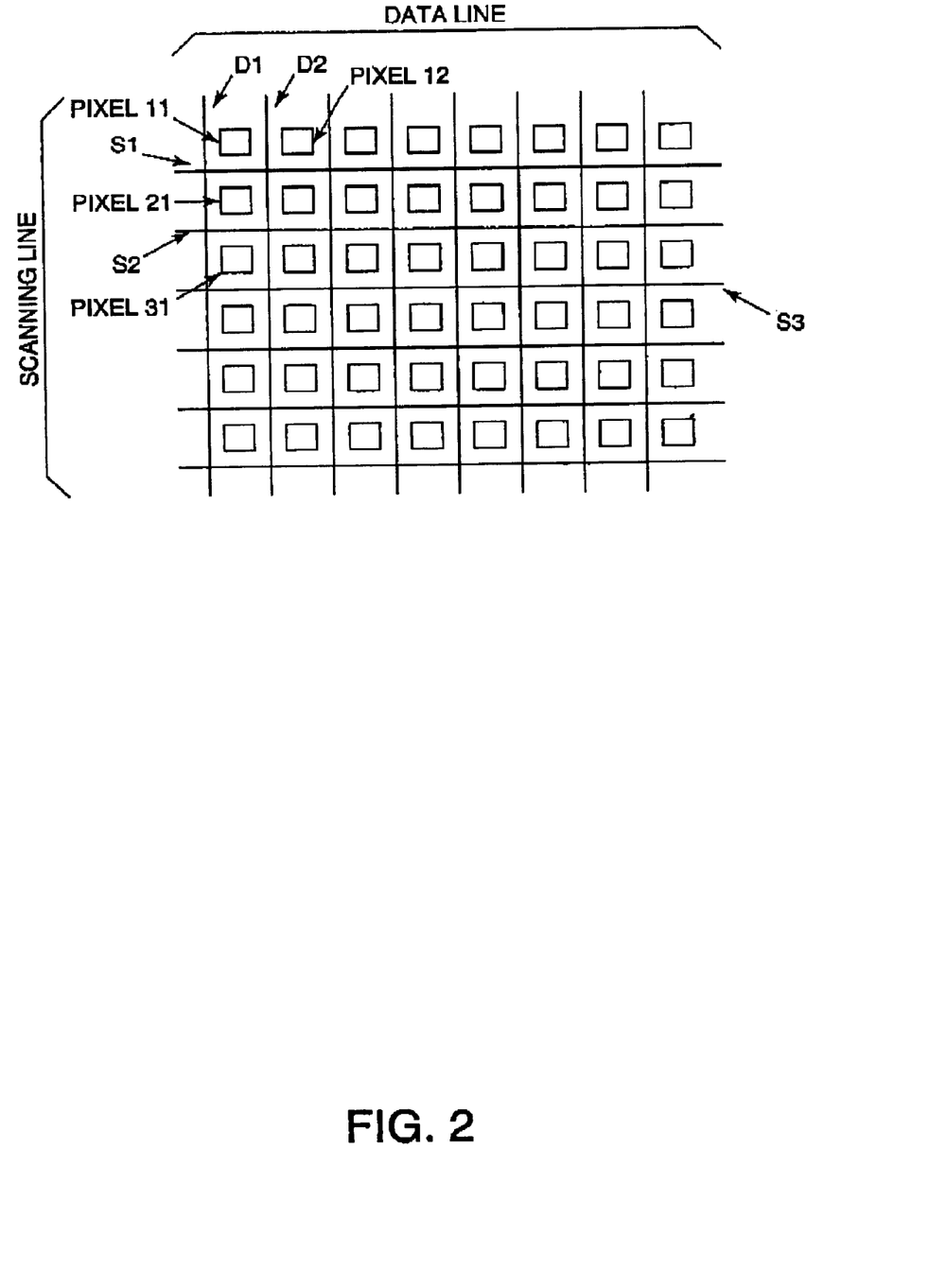
FIG. 2 is a schematic of a pixel arrangement of an electro-optical device according to an embodiment of the present invention.

FIG. 2 illustrates the wiring and the pixel arrangement of an electro-optical device according to an embodiment of the present invention. Pixels are arranged in a matrix by a plurality of scanning lines (S1, S2, . . . ) and a plurality of data lines (D1, D2, . . . ), and a plurality of pixels are formed at corresponding intersections of the scanning lines and the data lines. For example, a pixel 11 is provided at the intersection of S1 and D1. Basically, the pixel includes a switching transistor (ST11), a reset transistor (RT11), a capacitor (C11), a driving transistor (DT11), and a luminescent element (L11), such as those shown in FIG. 1. However, the pixel may include a plurality of sub-pixels. A power line (V) is not shown in FIG. 2.

Figure 3:
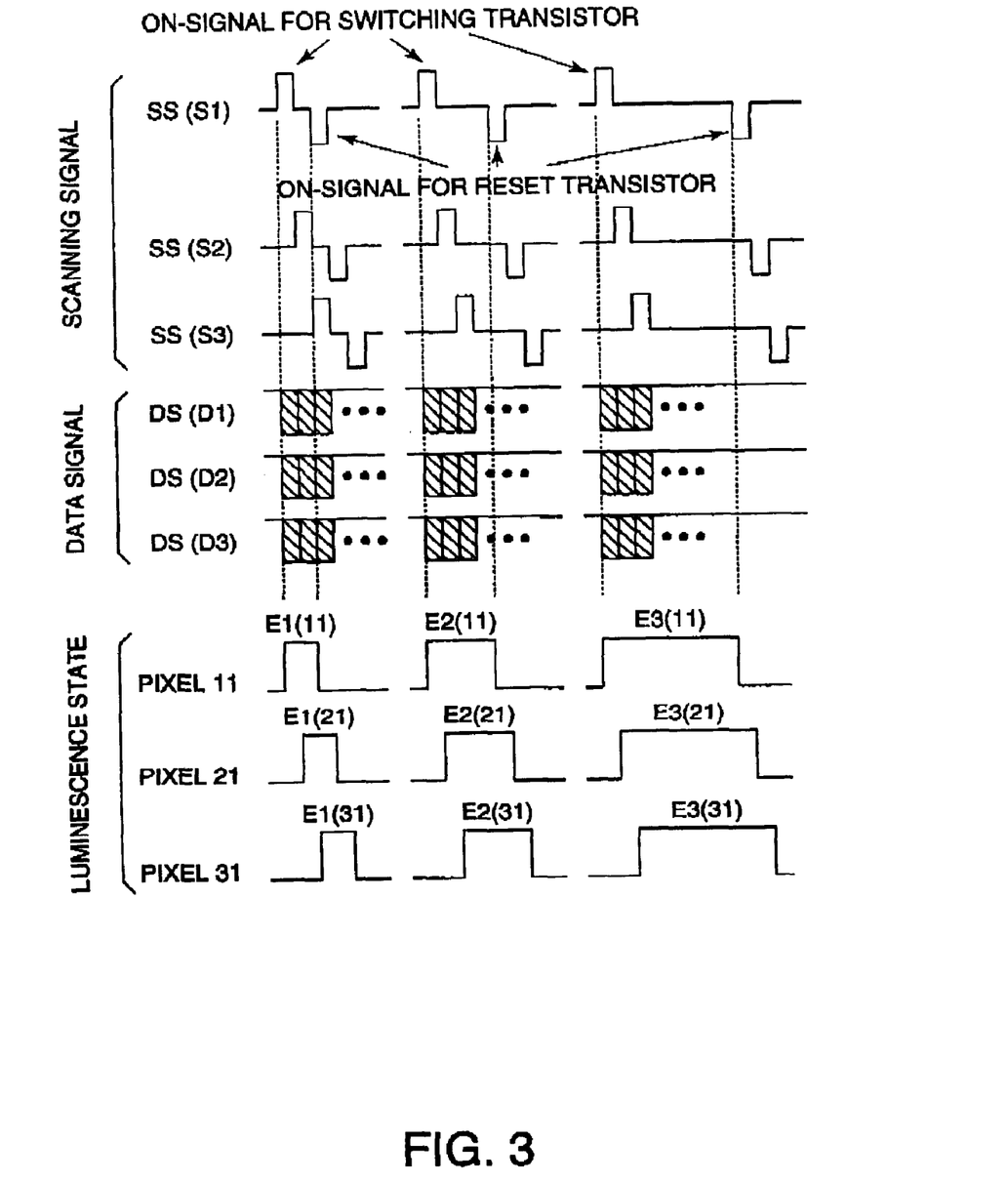
FIG. 3 is a schematic of a driving method for an electro-optical apparatus according to an embodiment of the present invention.

FIG. 3 illustrates a driving method for an electro-optical device which includes, the circuit shown in FIG. 1 and the pixel arrangement shown in FIG. 2, according to an embodiment of the present invention. A first scanning signal SS(S1) is supplied to the first scanning line (S1). A second scanning signal SS(S2) is supplied to the second scanning line (S2). A third scanning signal SS(S3) is supplied to the third scanning line (S3). A first data signal DS(D1) is supplied to the first data line (D1). A second data signal DS(D2) is supplied to the second data line (D2). A third data signal DS(D3) is supplied to the third data line (D3).

In this embodiment, the switching transistor (ST11), the driving transistor (D11), and the reset transistor (RT11) are n-type, p-type, and p-type, respectively. Accordingly, a high-potential scanning signal serves as an on-signal to cause the switching signal to enter the conducting state. Then, a low-potential set signal indicated by the hatched portions in FIG. 3 is supplied in accordance with the on-signal for the switching transistor. According to this setting step, the driving transistor enters the conducting state so as to cause the luminescent element to emit light. In contrast, the low-potential scanning signal serves as an on-signal for the reset transistor. According to this resetting step, a high potential is applied to the p-type driving transistor from the power line via the reset transistor so as to cause the driving transistor to enter the non-conducting state. Thus, the luminescence element enters the non-luminescence state.

The luminescence periods E1, E2, and E3 are defined by the time interval between the setting step and the resetting step. The ratio of the luminescence periods E1, E2, and E3 is set to be about 1:2:4. As a result, eight gray-scale levels, such as 0, 1, 2, 3, 4, 5, 6, and 7, are obtained. In this embodiment, the set-reset operations are sequentially performed such that the time interval between the setting step and the resetting step is increased. However, the set-reset operations do not have to be performed in this order, and can be performed according to the circumstances of the use or the specifications. It may take some time for the transistor or the luminescent element to respond to the corresponding signal. Accordingly, as shown in FIG. 3, the start time and the end time of the luminescence period may be displaced from the start of the setting step and the start of the resetting step, respectively. In FIG. 3, the period for which the on-signal for the switching transistor is supplied coincides with the period for which the set signal is supplied. However, depending on the circumstances of the use or the specifications, the on-signal does not always have to coincide with the set signal.

Figure 4:
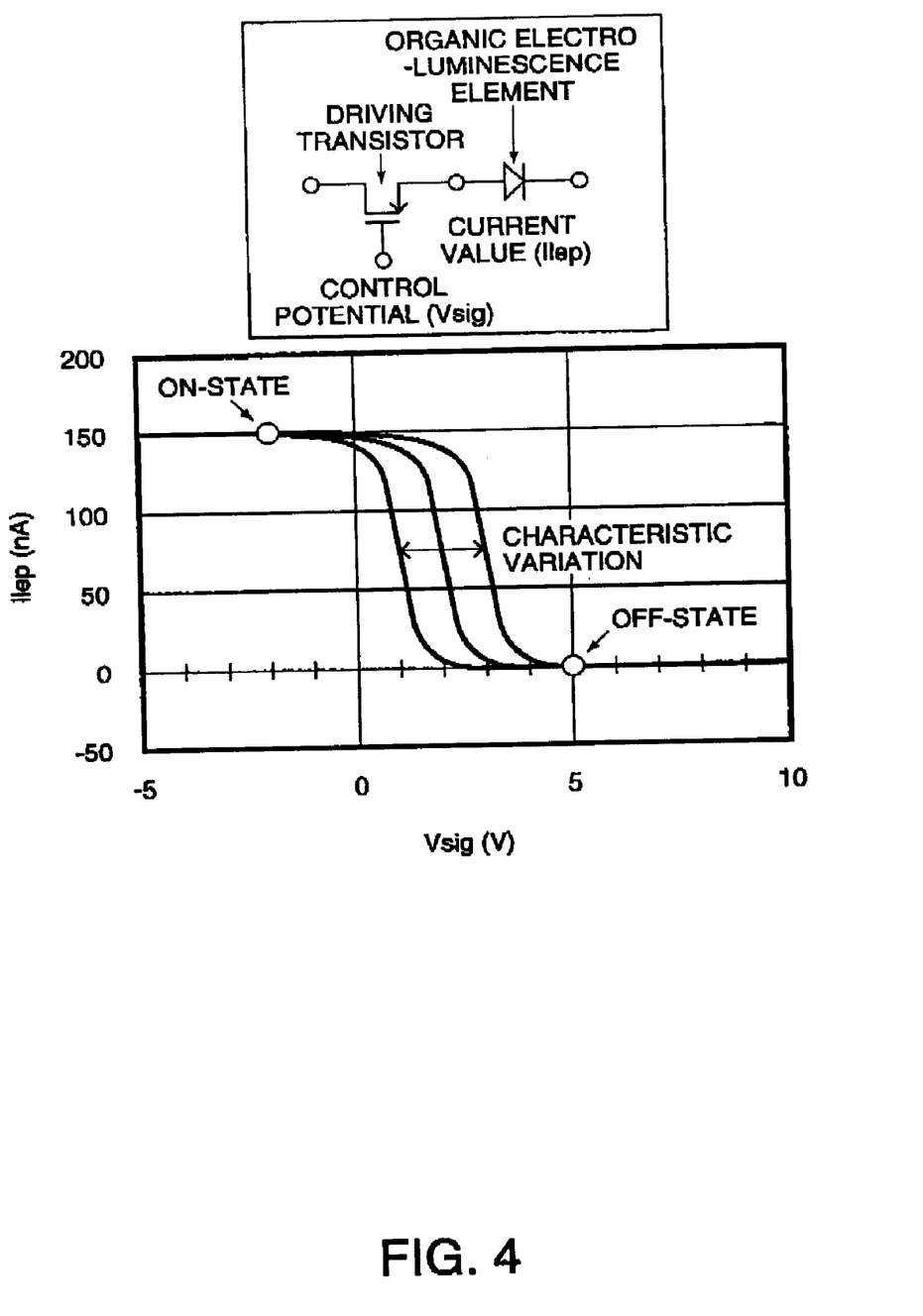
FIG. 4 is a schematic of current characteristics of a luminescent element according to an embodiment of the present invention.
Figure 5:
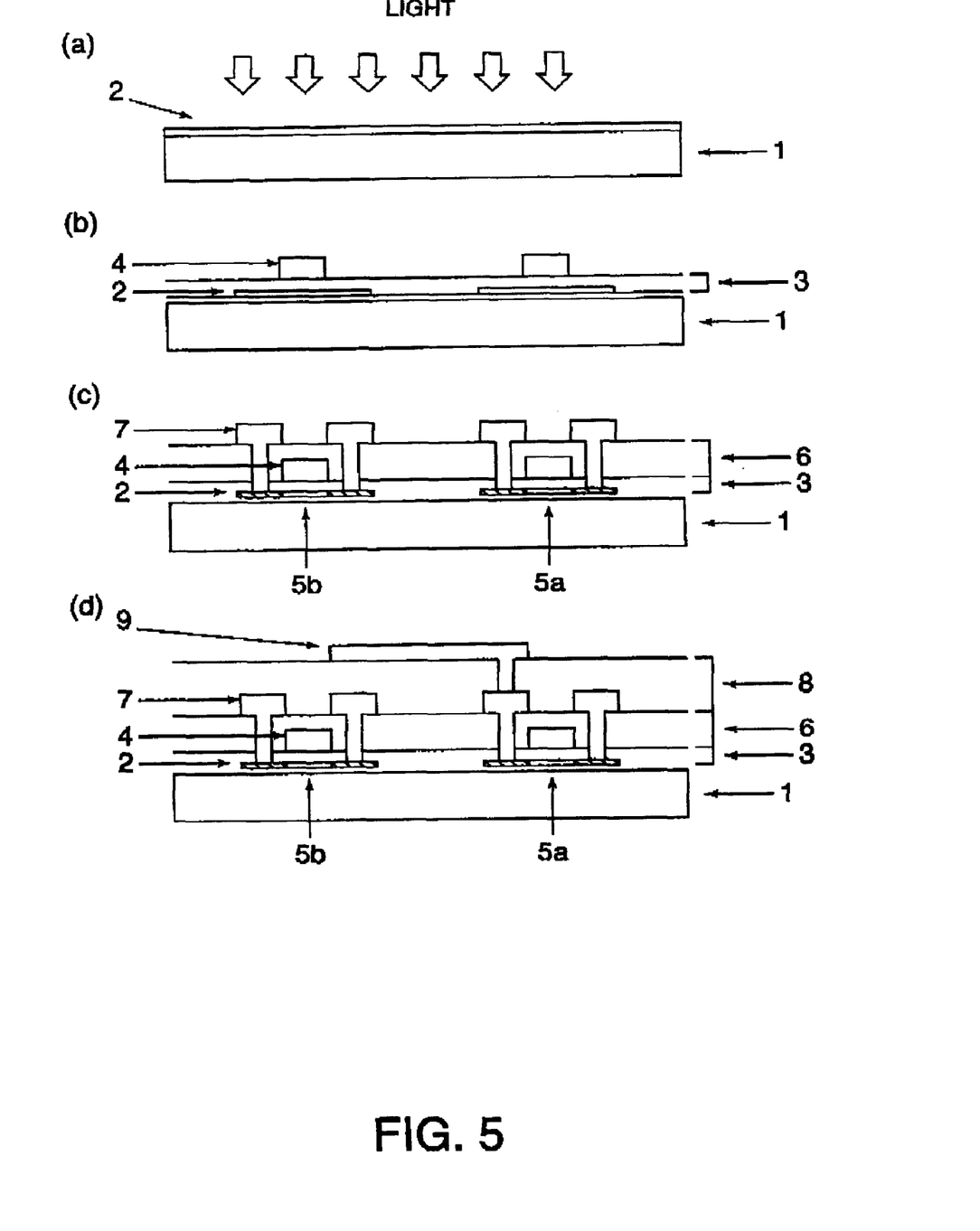
FIGS. 5(a)–5(d) are schematics showing part of a manufacturing process for an electro-optical device according to an embodiment of the present invention.

FIG. 4 illustrates the current characteristics of the luminescent element according to an embodiment of the present invention. The horizontal axis represents the control potential (Vsig) supplied to the gate electrode of the driving transistor, and the vertical axis designates the current value (Iiep) of the organic electro-luminescence element. The current value and the luminance of the organic electro-luminescence element are substantially proportional to each other. Thus, it can be considered that the vertical axis also indicates the luminance. In this embodiment, it is preferable that the organic electro-luminescence element is unambiguously controlled to be in either the on state or the off state. When the electro-luminescence element is unambiguously in the on state or in the off state, the current value (Iiep) is substantially constant even if the transistor characteristics are changed. Thus, the current value of the luminescent element does not change, and accordingly, the luminance substantially becomes uniform. Therefore, the image quality can be uniform.

FIGS. 5(a)–5(d) illustrate a manufacturing process for a thin-film transistor for use in the electro-optical device according to an embodiment of the present invention. Amorphous silicon is first formed on a glass substrate 1 by PECVD using $SiH_4$ or by LPCVD using $Si_2H_6$. The amorphous silicon is poly-crystallized by a laser, such as an excimer laser, or by solid-phase growth, thereby forming a poly-crystalline silicon layer 2 (FIG. 5(a)). After the poly-crystalline silicon layer 2 is patterned, a gate insulating film 3 is formed, and gate electrodes 4 are further formed (FIG. 5(b)). An impurity, such as phosphorus or boron, is implanted into the poly-crystalline silicon layer 2 by using the gate electrodes 4 according to a self-alignment process so as to form MOS transistors 5a and 5b. The MOS transistors 5a and 5b are a p-type transistor and an n-type transistor, respectively. The reset transistor is not shown in FIGS. 5(a)–5(d). After a first interlayer insulating film 6 is formed, contact holes are formed, and a source electrode and a drain electrode 7 are formed (FIG. 5(c)). Then, after a second interlayer insulating film 8 is formed, contact holes are formed, and a pixel electrode 9 including ITO is formed (FIG. 5(d)).

Figure 6:
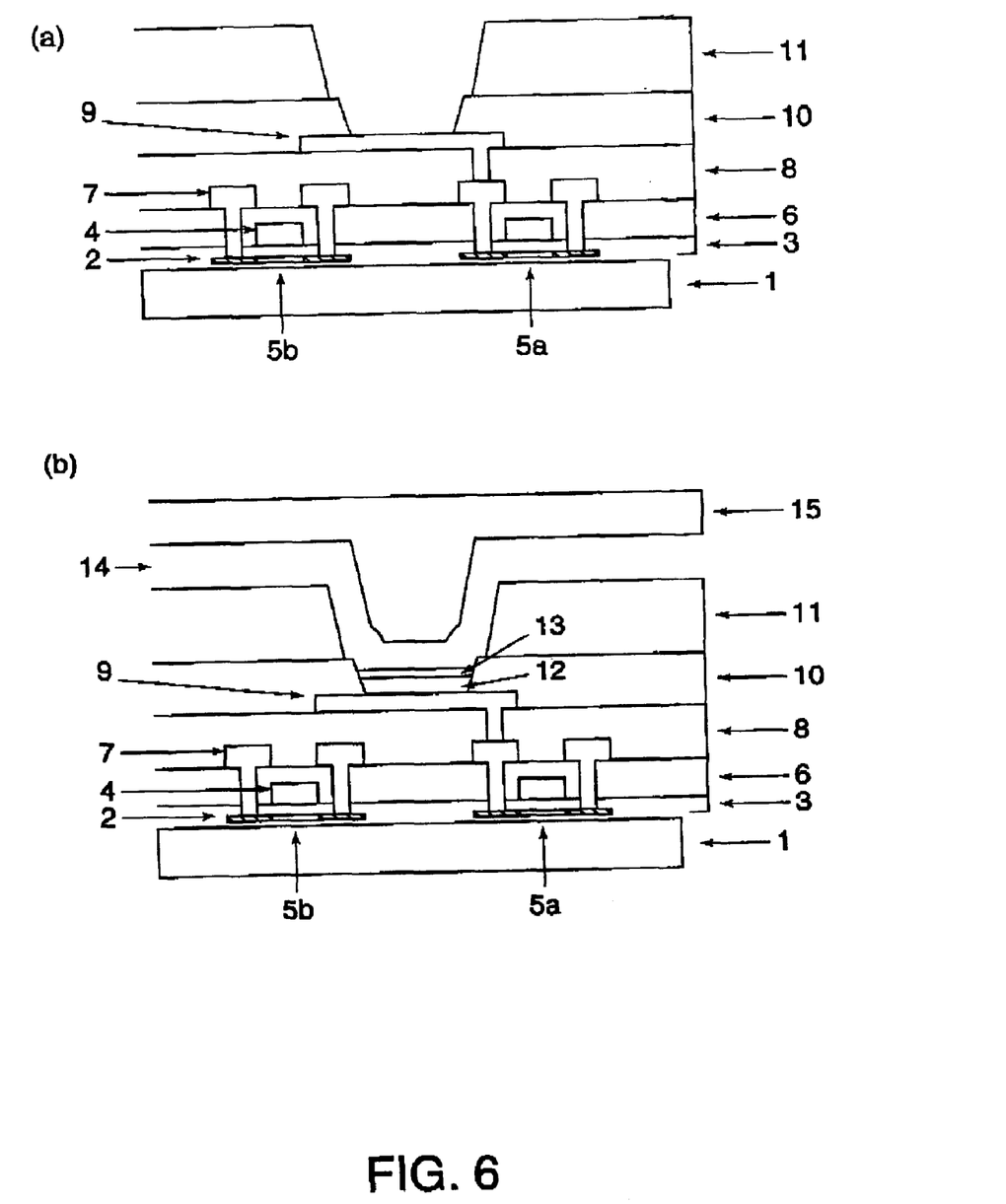
FIGS. 6(a) and 6(b) are schematics showing part of a manufacturing process for an electro-optical device according to an embodiment of the present invention.

FIGS. 6(a)–6(b) illustrate a manufacturing process for pixels used in the electro-optical device according to an embodiment of the present invention. First, an adhesion layer 10 is formed, and an opening corresponding to a luminescent region is formed. An interlayer 11 is then formed, and an opening is formed (FIG. 6(a)). Then, the wettability of the substrate surface is controlled by performing plasma processing using, for example, oxygen plasma or $CF_4$ plasma. Subsequently, an electron-hole implantation layer 12 and a luminescent layer 13 are formed by a liquid-phase process, such as a spin coating, squeegee, or ink-jet process, or a vacuum process, such as sputtering or deposition. An anode 14 containing metal, such as aluminum, is then formed. Finally, a sealing layer 15 is formed. Thus, an organic electro-luminescence element is manufactured (FIG. 6(b)). The roles of the adhesion layer 10 are to enhance the adhesion between the substrate and the interlayer 11 and also to obtain an accurate luminescence area. The roles of the interlayer 11 are to reduce the parasitic capacitance by separating the gate electrodes 4, the source electrodes, and the drain electrodes 7 from the anode 14, and also to perform precise patterning by controlling the surface wettability when forming the electron-hole implantation layer 12 and the luminescent layer 13 by a liquid-phase process.

Figure 7:
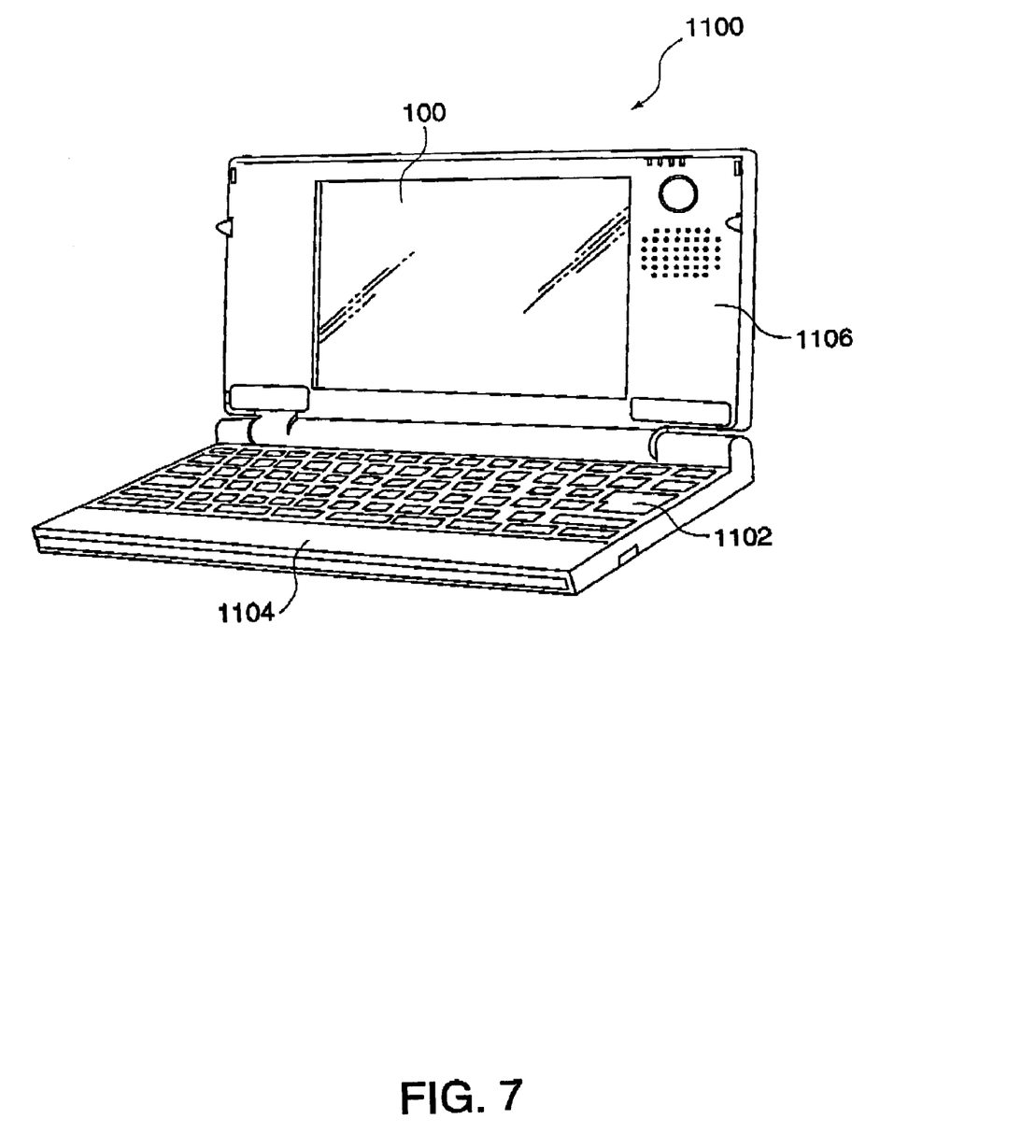
FIG. 7 is a perspective view of an example of an electro-optical device of an embodiment of the present invention applied to a mobile personal computer.

Some examples of electronic apparatuses using the above-described electro-optical device are described below. FIG. 7 is a perspective view illustrating the configuration of a mobile personal computer to which the above-described electro-optical device is applied. In FIG. 7, a personal computer 1100 includes a main unit 1104 provided with a keyboard 1102, and a display unit 1106. The display unit 1106 is provided with the above-described electro-optical device 100.

Figure 8:
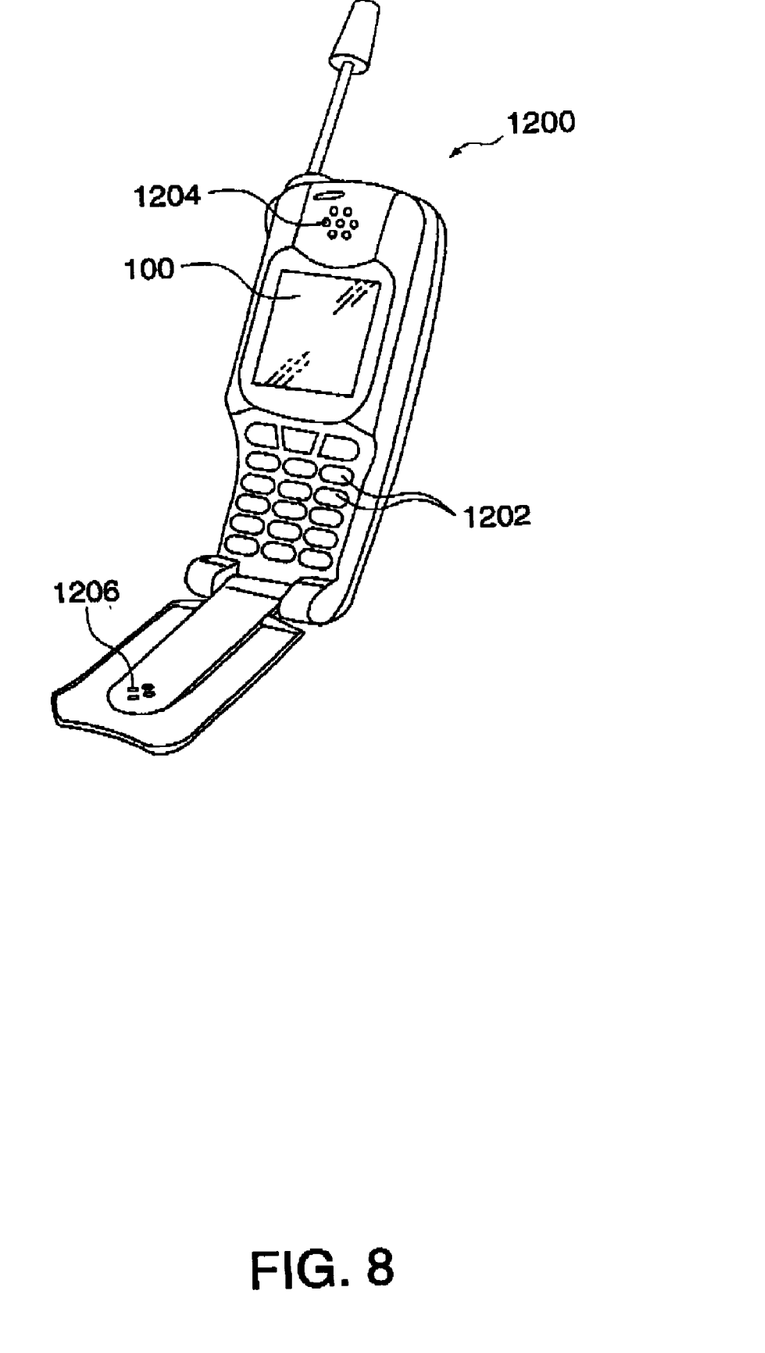
FIG. 8 is a perspective view of an example of an electro-optical device of an embodiment of the present invention applied to a display unit of a cellular telephone.

FIG. 8 is a perspective view illustrating a configuration of a cellular telephone having a display unit to which the aforementioned electro-optical device 100 is applied. In FIG. 8, a cellular telephone 1200 includes, not only a plurality of operation buttons 1202, but also the above-described electro-optical device 100 together with an earpiece 1204 and a mouthpiece 1206.

Figure 9:
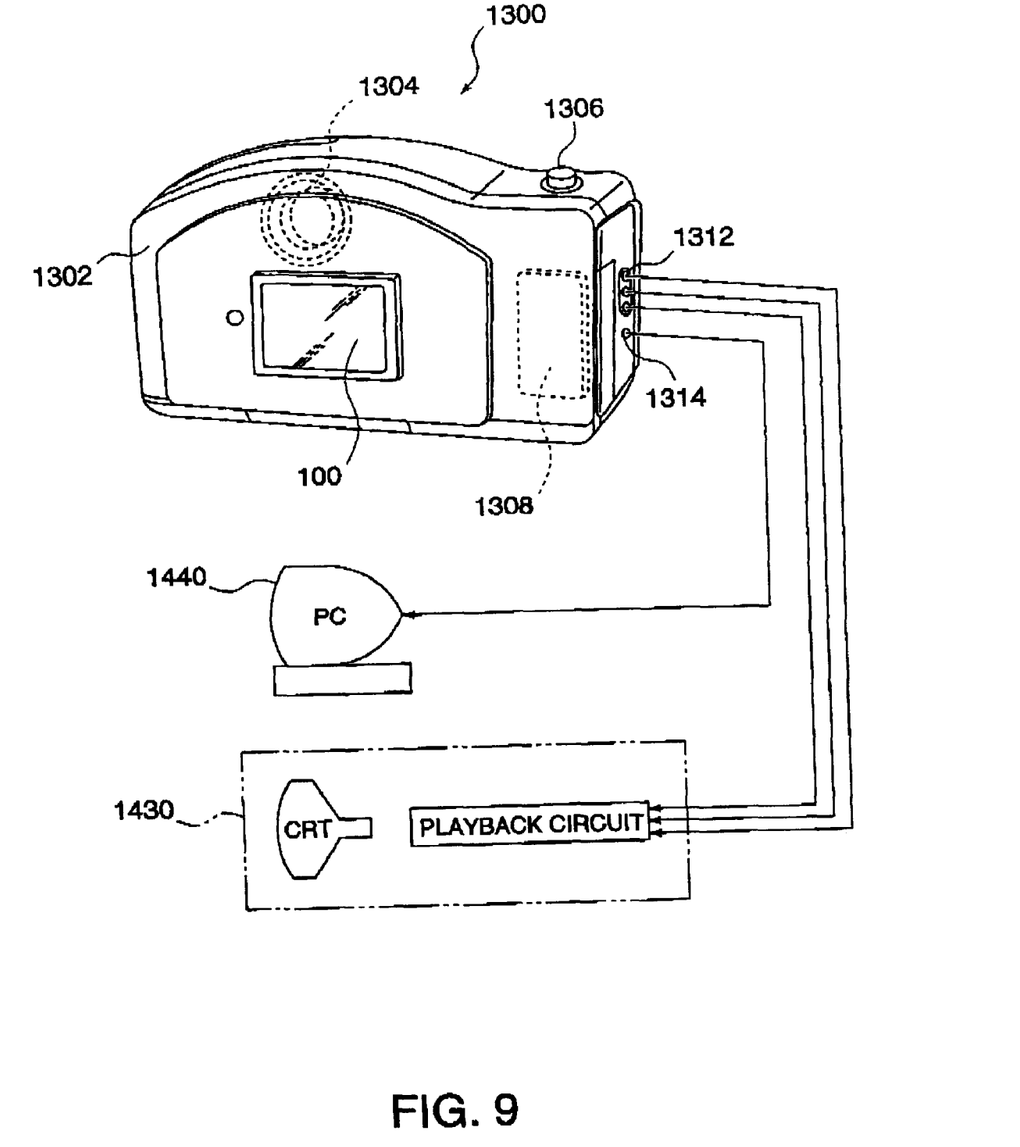
FIG. 9 is a perspective view of a digital still camera having a finder to which an electro-optical device of an embodiment of the present invention is applied.

FIG. 9 is a perspective view illustrating a configuration of a digital still camera having a finder to which the above-described electro-optical device 100 is applied. FIG. 9 also schematically illustrates the connection of the digital still camera with external devices. In a regular camera, a film is exposed to light by an optical image of a subject. In a digital still camera 1300, however, an optical image of a subject is photoelectrically converted by an image pickup device, such as a CCD (Charge Coupled Device), so as to generate an imaging signal. On the rear surface of a casing 1302 of the digital still camera 1300, the aforementioned electro-optical device 100 is provided to display the subject based on the imaging signal obtained by the CCD. That is, the electro-optical device 100 serves as a finder to display the subject. A photodetector unit 1304, including an optical lens and a CCD, is disposed on the observation side (on the reverse surface in FIG. 9) of the casing 1302.

A photographer checks the subject displayed on the electro-optical device 100 and presses a shutter button 1306. Then, an imaging signal obtained by the CCD is transferred to and stored in a memory of a circuit board 1308. In this digital still camera 1300, a video signal output terminal 1312 and a data communication input/output terminal 1314 are provided on the side surface of the casing 1302. Then, as shown in FIG. 9, a television monitor 1430 and a personal computer 1440 are connected to the video signal output terminal 1312 and the data communication input/output terminal 1314, respectively, as required. The imaging signal stored in the memory of the circuit board 1308 is output to the television monitor 1430 or the personal computer 1440 by a predetermined operation.

Electronic apparatuses to which the electro-optical device 100 of the present invention is applicable include, not only the personal computer shown in FIG. 7, the cellular telephone shown in FIG. 8, and the digital still camera shown in FIG. 9, but also a liquid crystal television, a view-finder-type or direct-view-type video cassette recorder, a car navigation system, a pager, an electronic diary, a calculator, a word processor, a workstation, a videophone, a POS terminal, a device provided with a touch panel, for example. The above-described electro-optical device 100 is applicable to the display units of these electronic apparatuses.

What is claimed is:

1. A driving method for an electro-optical device which includes, at an intersection of a scanning line and a data line, an electro-optical element, a driving transistor that drives the electro-optical element, a switching transistor that controls the driving transistor, and a reset transistor that resets the driving transistor to a non-conducting state, the driving method comprising:

a setting step of supplying an on-signal to cause the switching transistor to be in an on-state to the switching transistor via the scanning line, and of supplying a set signal to select a conducting state or a non-conducting state of the driving transistor to the driving transistor via the data line and the switching transistor in accordance with a period for which the on-signal is supplied; and a resetting step of supplying an on-signal to cause the reset transistor to be an on-state to the reset transistor via the scanning line so as to reset the driving transistor to the non-conducting state.

2. A driving method for an electro-optical device according to claim 1, further including, with a power line, supplying a current to the electro-optical element via the driving transistor, and connecting one end of the reset transistor to the power line.

3. The driving method for an electro-optical device according to claim 1, further including providing a conductivity type of the switching transistor and a conductivity type of the reset transistor that are different from each other.

4. The driving method for an electro-optical device according to claim 1, further including providing conductivity types of the switching transistor, the driving transistor, and the reset transistor that are respectively n-type, p-type, and p-type.

5. The driving method for an electro-optical device according to claim 4, further including providing a voltage VS corresponding to the on-signal to cause the switching transistor to be in the on-state, a voltage VR corresponding to the on-signal to cause the reset transistor to be in the on-state, and a voltage V0 corresponding to an off-signal to cause the switching transistor and the reset transistor to be in an off-state so as to satisfy a relational expression: VS>V0>VR.

6. The driving method for an electro-optical device according to claim 5, further including providing the voltage VS, the voltage VR, and the voltage V0 so as to satisfy relational expressions: $-VS \approx$, VR and V0=0V (voltages).

7. The driving method for an electro-optical device according to claim 1, further including, while the switching transistor is in the on-state, providing the reset transistor in the off-state, and, while the reset transistor is in the on-state, providing the switching transistor in the off-state.

8. The driving method for an electro-optical device according to claim 1, further including obtaining a grayscale by setting a time interval between the setting step and the resetting step.

9. The driving method for an electro-optical device according to claim 1, further including obtaining a grayscale by performing a plurality of set-reset operations, each set-reset operation including the setting step and the resetting step.

10. The driving method for an electro-optical device according to claim 9, further including the time interval between the setting step and the resetting step to be different for each of the plurality of set-reset operations.

11. The driving method for an electro-optical device according to claim 9, further including providing the time interval between the setting step and the resetting step for each of the plurality of set-reset operations to be completely different from the others, and the ratio of time intervals for the plurality of set-reset operations to be about $1:2: \ldots :2^n$ (n being an integer of one or more) based on the minimum time interval.

12. The driving method for an electro-optical device according to claim 1, further including providing the set signal to be a signal to set the driving transistor to the conducting state rather than the signal to select the conducting state or the on-conducting state of the driving transistor.

13. The driving method for an electro-optical device according to claim 1, further including providing the electro-optical element that includes an organic electroluminescence element.

14. An electro-optical device driven by the driving method according to claim 1.

15. An electro-optical device, comprising:
- a scanning line;
- a data line;
- an electro-optical element at an intersection of the scanning line and the data line;
- a driving transistor that drives the electro-optical element;
- a switching transistor that controls the driving transistor;
- a reset transistor that resets the driving transistor to a non-conducting state;
- at least one drive circuit that generates a signal to set the switching transistor and the reset transistor to be in an on-state or an off-state via the scanning line, and that generates a signal to set the driving transistor in accordance with the signal to set the switching transistor to be in the on-state.

16. An electro-optical device, comprising:
- a scanning line;
- a data line;
- an electro-optical element at an intersection of the scanning line and the data line;
- a driving transistor that drives the electro-optical element;
- a switching transistor that controls the driving transistor;
- a reset transistor that resets the driving transistor to a non-conducting state;
- a scanning line driver that supplies a signal to set the switching transistor and the reset transistor to be in an on-state or an off-state to the scanning line; and
- a data line driver that supplies a signal to set the driving transistor to the data line in accordance with an operation of the scanning line driver.

17. An electro-optical device comprising:
- a scanning line;
- a data line;
- an electro-optical element at an intersection of the scanning line and the data line;
- a driving transistor that drives the electro-optical element;
- a switching transistor that controls the driving transistor; and
- a reset transistor that resets the driving transistor to a non-conducting state, an on-signal that performs a setting step of setting the electro-optical element being supplied to the switching transistor via the scanning line, and an on-signal that performs a resetting step of resetting the electro-optical element being supplied to the reset transistor via the scanning line.

18. The electro-optical device according to claim 15, the electro-optical device further including a power line that supplies a current to the electro-optical element via the driving transistor, and one end of the reset transistor being connected to the power line.

19. The electro-optical device according to claim 15, the electro-optical element including an organic electroluminescence element.

20. An electronic apparatus, comprising:
the electro-optical device set forth in claim 14.

* * * * *